(12) United States Patent
Wu et al.

(10) Patent No.: US 8,889,435 B2
(45) Date of Patent: Nov. 18, 2014

(54) PLASMA DENSITY CONTROL

(75) Inventors: Wen-Sheng Wu, Hsin-Chu (TW); Fei-Fan Chen, Hsin-Chu (TW); Chia-I Shen, Hsin-Chu (TW); Hua-Sheng Chiu, Zhudong Town (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 50 days.

(21) Appl. No.: 13/248,955

(22) Filed: Sep. 29, 2011

(65) Prior Publication Data

US 2013/0084657 A1    Apr. 4, 2013

(51) Int. Cl.
*H01L 21/66* (2006.01)
*H01J 37/32* (2006.01)

(52) U.S. Cl.
CPC .............. *H01J 37/321* (2013.01); *H01L 22/12* (2013.01); *H01L 22/20* (2013.01); *H01J 37/32935* (2013.01); *H01L 22/26* (2013.01)
USPC .............................. 438/14; 438/710; 438/733

(58) Field of Classification Search
USPC ........................................ 438/14, 710, 733
See application file for complete search history.

(56) References Cited

U.S. PATENT DOCUMENTS

| 5,311,103 | A  | * | 5/1994  | Asmussen et al. | 315/111.81 |
| 6,545,420 | B1 | * | 4/2003  | Collins et al.  | 315/111.51 |
| 6,614,051 | B1 | * | 9/2003  | Ma              | 257/48     |
| 7,075,771 | B2 | * | 7/2006  | Brcka           | 361/234    |
| 7,838,831 | B2 | * | 11/2010 | Nagahama        | 250/310    |
| 8,076,247 | B2 | * | 12/2011 | Collins et al.  | 438/714    |
| 8,093,072 | B2 | * | 1/2012  | Ishimaru        | 438/14     |
| 2010/0294199 | A1 | * | 11/2010 | Tran et al.   | 118/723 R  |

OTHER PUBLICATIONS

Nguyen, S. V., "High-density plasma chemical vapor deposition of silicon-based dielectric films for integrated circuits," Journal of Research and Development, 1999, pp. 1-19, vol. 43, No. 1/2, IBM Corporation.

* cited by examiner

*Primary Examiner* — Telly Green
*Assistant Examiner* — Damian A Hillman
(74) *Attorney, Agent, or Firm* — Slater and Matsil, L.L.P.

(57) ABSTRACT

A first embodiment is a method for semiconductor processing. The method comprises forming a component on a wafer in a chamber; determining a non-uniformity of the plasma in the chamber, the determining being based at least in part on the component on the wafer; and providing a material on a surface of the chamber corresponding to the non-uniformity. The forming the component includes using a plasma. The material can have various shapes, compositions, thicknesses, and/or placements on the surface of the chamber. Other embodiments include a chamber having a material on a surface to control a plasma uniformity.

21 Claims, 3 Drawing Sheets

PLASMA DENSITY CONTROL

BACKGROUND

Since the development of the integrated circuit (IC), the semiconductor industry has experienced continued rapid growth due to continuous improvements in the integration density of various electronic components (e.g., transistors, diodes, resistors, capacitors, etc.). For the most part, this improvement in integration density has come from repeated reductions in minimum feature size, which allows more components to be integrated into a given area. The continued reduction in minimum feature size has been accompanied by challenges.

In the fabrication of these ICs, processes typically include the deposition of various materials. Some of the depositions may be by using a high density plasma (HDP) chemical vapor deposition (CVD). With the reduction in minimum feature size, the HDP-CVD process has encountered problems. The HDP-CVD process may have poor uniformity of deposition for small technology nodes and, thus, may have a process window limit for corresponding hardware.

Previous attempts to solve these problems include a trial and error process where nozzles within a tool would be adjusted to control the deposition. However, this typically caused other problems. The trial and error process typically required the tool to be opened to have the nozzles adjusted. This required significant down time for the tool. Thus, these previous attempts wasted available tool time that could have been used to process wafers. Further, by having the tool opened, the tool would possibly be exposed to contaminants, and the continuous adjusting of parts could decrease the useful life of those parts necessitating increased parts costs.

Accordingly, a better solution to allow for the use of plasma processes at smaller technology nodes is needed to aid in the further reduction of minimum feature size.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a process using a high density plasma for deposition of materials in semiconductor processing. Other embodiments may also be applied, however, to other applications where a plasma is used in processing. One application in which a high density plasma may be used is a deposition for a thin film transistor liquid crystal display (TFT-LCD).

Figure 1:
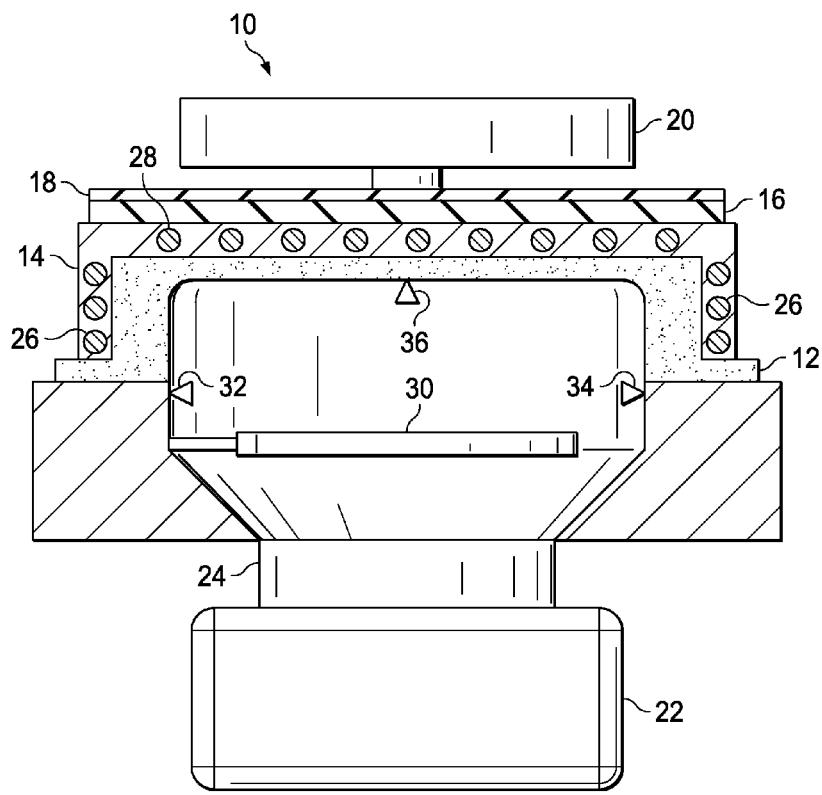
FIG. 1 is a chamber for depositing a material according to an embodiment.

With reference now to FIG. 1, there is shown a chamber 10 for depositing a material according to an embodiment. The chamber 10 includes a dome 12, a coil cap 14, an anti-electromagnetic (AEM) material 16, a thermalgom 18, a remote plasma source 20, a pump 22, and a throttle valve 24. A side coil 26 is in a lateral portion of the coil cap 14, and a top coil 28 is in an upper portion of the coil cap 14. A wafer tray 30 is inside the chamber 10. A first side nozzle 32 and a second side nozzle 34 are on respective interior sidewalls of the chamber 10, and a top nozzle is on an interior upper wall of the chamber 10.

The dome 12 in this embodiment is a ceramic dome and encloses the upper portion of the chamber 10. The coil cap 14 encases an outer sidewall and outer upper surface of the dome 12. The AEM material 16 is on an exterior upper surface of the coil cap 14. The thermalgom 18 is over the AEM pattern 16 and the coil cap 14. The pump 22 is at a lower portion of the chamber 10, and the throttle valve 24 is disposed between the pump 22 and the interior of the chamber 10.

Figure 2:
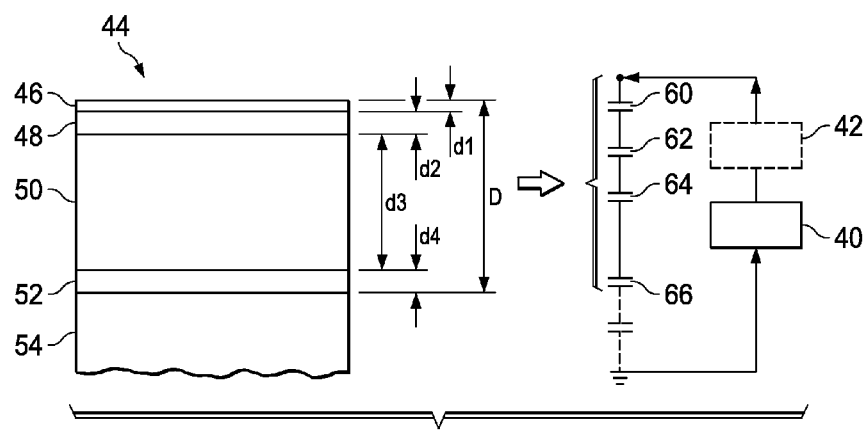
FIG. 2 is a simplified view of the chamber that is represented by a serial capacitance load according to an embodiment.

A radio frequency (RF) power generator 40 of the chamber 10, such as an 11 kilowatt RF generator used in conjunction with the top coil 28 and the side coil 26, may have a load modeled including serial capacitances, such as shown in FIG. 2. The power generator 40 may have a power control 42, as indicated by a dashed box, to stabilize and control a power level. FIG. 2 illustrates a simplified view 44 of the chamber 10 that is represented by a serial capacitance load. The power generator 40 that generates an RF electromagnetic field has a load that is affected by the different materials and compositions of the various components of the chamber 10. For example, the material 46 of the thermalgom 18 is represented by a capacitance 60 based on the thickness d1 of the thermalgom 18. The material 48 of the AEM material 16 is represented by a capacitance 62 based on the thickness d2 of the AEM material 16. The material 50 of the dome 12 is represented by a capacitance 64 based on the thickness d3 of the dome 12. The material 52 of a plasma sheath (not specifically illustrated in FIG. 1) is represented by a capacitance 64 based on the thickness d4 of the sheath. Also, other components such as the bulk plasma 54 of the chamber 10 can cause various loads on the power generator, although not specifically illustrated.

The different components and materials cause a serial capacitance that results in a voltage divider when the power generator 40 is supplying RF power. Each of the materials 46, 48, 50, and 52 has a respective relative permittivity $\epsilon_{R_n}$ and a respective thickness $d_n$ that determines, at least in part, the capacitance caused in the load by the respective material. The capacitance caused by each material can be generally calculated by $$C_n = \frac{\epsilon_{R_n} \epsilon_0 A_n}{d_n},$$

where $C_n$ is the capacitance of the n material, $\epsilon_{Rn}$ is the relative permittivity of the n material, $\epsilon_0$ is the permittivity of air, $A_n$ is the area of the n material as generally described as plates, and $d_n$ is the thickness of the n material. When in series as shown in FIG. 2, the voltage across any material is dependent upon the capacitance of other components in series. Generally, the voltage for one component in series is proportional to the product of the other series capacitances divided by the sum of various products of the series capacitances. Thus, for non-negligible capacitance values, if a capacitance is increased for one component, the voltage drop across another component will increase while the RF generator is generating power. Therefore, the voltage drop across a component can be controlled by varying parameters of another component in the series capacitance.

In this example, an inductively coupled plasma can be generated by applying a RF electromagnetic field through the chamber 10 to energize and create the plasma. The ionized atoms or molecules within the plasma then are able to bombard a surface of a wafer on the wafer tray and react with other atoms or molecules to form a solid film on the wafer surface. This reaction can be affected by spurious or non-uniform electromagnetic fields through the chamber 10. Spurious or non-uniform electromagnetic fields can cause variations in the voltage across the plasma, which then may result in a non-uniform plasma. The non-uniform plasma can result in a non-uniform deposition. By adding an AEM pattern in areas of a spurious or non-uniform electromagnetic field, a voltage across the plasma caused by the spurious or non-uniform electromagnetic field can be controlled to the intended voltage caused by the RF power generator. Accordingly, the voltage across the plasma can become more uniform resulting in a more uniform deposition.

Figure 3:
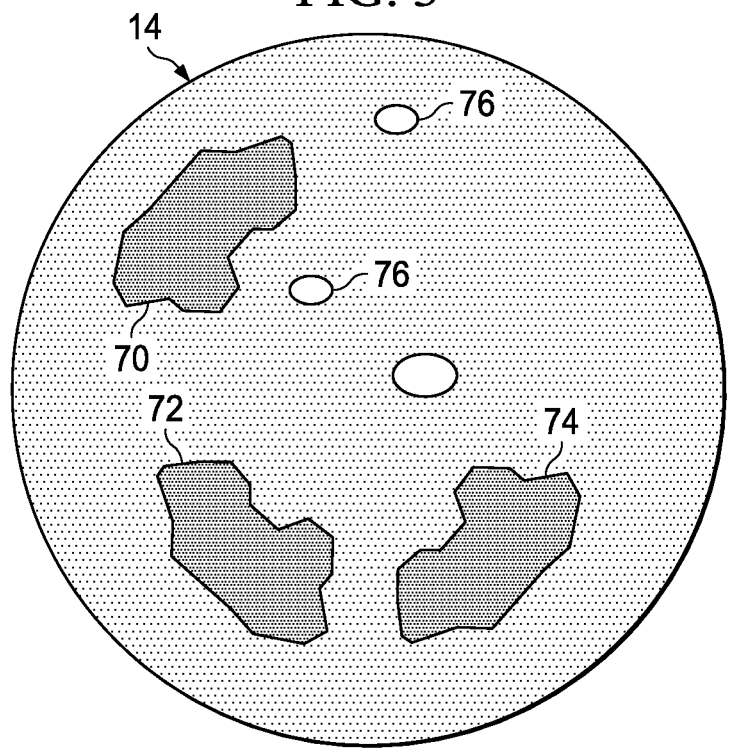
FIG. 3 shows examples of patterns of an anti-electromagnetic (AEM) on the dome of the chamber according to an embodiment.
Figure 4:
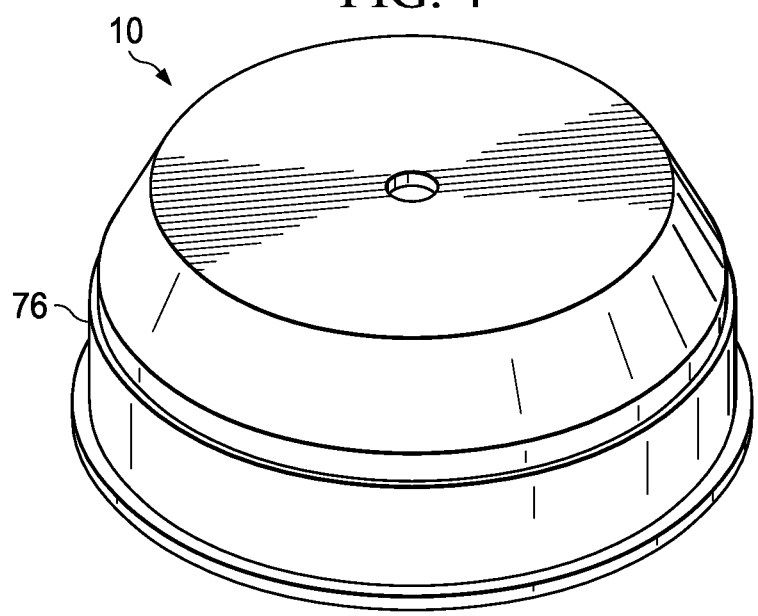
FIG. 4 shows another example of a pattern of an AEM on the lateral outer surface of the dome of the chamber according to an embodiment.

Embodiments contemplate using a material for the AEM material 16 that blocks extraneous or non-uniform voltage from spurious or non-uniform electromagnetic radiation by changing the capacitance in the area in which the non-uniformity is caused. By controlling the capacitance in the area of the non-uniformity, a corresponding voltage drop across the capacitance can result in better uniformity of radiation in the remainder of the chamber. For example, FIG. 3 illustrates examples of patterns 70, 72, and 74 of an AEM material 16 on the dome 12 of the chamber 10. These patterns 70, 72, and 74 generally correspond to areas of non-uniformity of radiation through the dome 12 of the chamber 10. By placing these patterns 70, 72, and 74 as shown in this example, the uniformity of the plasma in the chamber is increased. FIG. 4 illustrates another example of a pattern 76 of an AEM material 16 on the lateral outer surface of the dome 12 of the chamber 10. In this embodiment, the pattern 76 wraps around the entire chamber 10, and other embodiments contemplate that similar patterns do not wrap around the entirety of the chamber 10. The pattern 76 blocks voltage caused by spurious or non-uniform radiation from affecting the chamber 10 from the side of the chamber. It should be noted that the patterns 70, 72, 74, and 76 can be used in any combination and at any location, even on further surfaces of the chamber 10.

Examples of materials for the AEM material include aluminum oxide ($Al_2O_3$), titanium oxide ($TiO_2$), iron (Fe), the like, or a combination thereof. Example thicknesses of the AEM material 16 in experiments range from approximately 200 micrometers to approximately 20 mils for $Al_2O_3$ patterns on a top surface of a dome and from approximately 350 micrometers to approximately 60 mils for $Al_2O_3$ patterns on a side surface of the dome. The patterns may be formed using, for example, acceptable stamping techniques, the like, or a combination thereof. It should be noted that the same or different patterns of the same or different materials with the same or varying thicknesses on the same or different surfaces may be used simultaneously.

Figure 5:
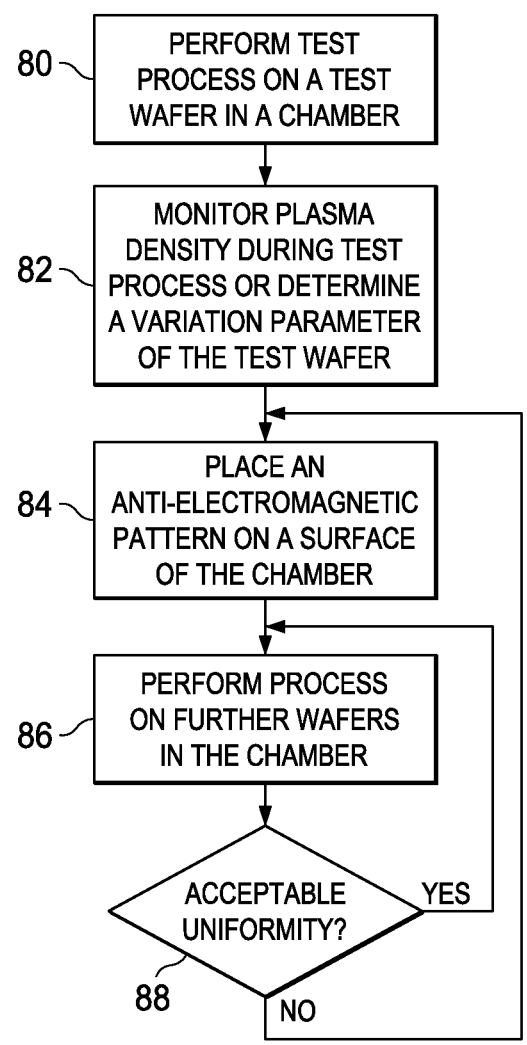
FIG. 5 is a flowchart of an embodiment to control plasma density.

FIG. 5 is a flowchart of an embodiment to control plasma density. In step 80, a test process, such as a high density plasma deposition, is performed on a test wafer in a chamber. In step 82, the plasma density in the chamber during the test process is monitored and/or a variation parameter of the test wafer as a result of the test process is determined. The plasma density in the chamber during the test process can be monitored, for example, by a metrology tool, such as using an optic model, to measure the film thickness and uniformity. An example variation parameter of a test wafer, when the test process is a deposition, is a thickness uniformity or variation of the film deposited on a wafer or substrate surface. Where non-uniform or spurious radiation is introduced into the chamber, in step 84, an AEM pattern is placed on a surface of the chamber. The size, shape, thickness, material type, and/or location of the AEM material correspond to the non-uniformity from the monitoring and/or the variation parameter. The various parameters of the AEM material can be optimized based on further testing, as shown in subsequent steps. In step 86, further wafers are processed in the chamber, and in step 88, the uniformity of the plasma and/or variation parameter of the further wafers is determined. If the uniformity is acceptable in step 88, the process returns to step 86 where further wafers are processed. The uniformity may or may not be continuously monitored during subsequent processing. If the uniformity is not acceptable in step 88, the process returns to step 84 where an AEM material is placed on a surface of the chamber. This can include modifying the AEM material that was previously placed on the chamber. The process can continue to loop until an acceptable uniformity is achieved.

Embodiments can use AEM materials with various parameters, such as material type, thickness, shape, location, etc., to control the voltage drop caused by an electromagnetic field in a plasma chamber. By controlling the voltage drop, the uniformity of the plasma can be increased to thereby increase the uniformity of the results of the plasma process, such as increase the uniformity of film thickness resulting from a plasma deposition. Embodiments may be used to customize particular chambers in particular locales to improve plasma uniformity. Thus, using embodiments, costs can be reduced by having more uniform results of a plasma process, more processed wafers can be within acceptable limits, and a process window for technology nodes can be enlarged. Further, in a physical vapor deposition (PVD) pre-clean chamber, by-product adhesion can be improved.

A first embodiment is a method for semiconductor processing. The method comprises forming a component on a wafer in a chamber; determining a non-uniformity of the plasma in the chamber, the determining being based at least in part on the component on the wafer; and providing a material on a surface of the chamber corresponding to the non-uniformity. The forming the component includes using a plasma.

Another embodiment is a method for semiconductor processing. The method comprises performing a test process on a test wafer in a chamber, the test process including using a plasma; determining a non-uniformity of the plasma in the chamber; and providing a material on a surface of the chamber corresponding to the non-uniformity.

Another embodiment is a method for semiconductor processing. The method comprises determining a non-uniformity of an electromagnetic field through a chamber, the electromagnetic field being during a test process in the chamber, the test process including using a plasma; determining a parameter of a material to control a voltage across the plasma resulting from the non-uniformity; and placing the material on a surface of the chamber based on the parameter.

A further embodiment is an apparatus for semiconductor processing. The apparatus comprises a dome, a coil cap, a power generator, and a pattern of a material. The dome covers a volume. The coil cap is on an exterior surface of the dome, and the coil cap includes a first coil. The power generator is electrically coupled to the first coil, and the first coil is operable to generate an electromagnetic field in the volume. The pattern of a material is coupled to a surface of the coil cap, and the pattern is not uniformly coupled to a whole of the surface of the coil cap.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for semiconductor processing, the method comprising:
    forming a component on a wafer in a chamber, the forming including using a plasma;
    determining a non-uniformity of the plasma in the chamber, the determining being based at least in part on the component on the wafer; and
    providing a material on a surface of the chamber corresponding to the non-uniformity.

2. The method of claim 1, wherein the forming the component includes a high density plasma deposition.

3. The method of claim 1, wherein the determining the non-uniformity of the plasma includes determining a variation on a substrate surface.

4. The method of claim 1, wherein the material is selected from the group consisting essentially of aluminum oxide ($Al_2O_3$), titanium oxide ($TiO_2$), iron (Fe), or a combination thereof.

5. The method of claim 1, wherein the material has a pattern corresponding to the non-uniformity of the plasma.

6. The method of claim 1 further comprising determining a parameter of the material to reduce the non-uniformity of the plasma in a subsequent process in the chamber.

7. The method of claim 6, wherein the parameter of the material includes a thickness, a placement on the surface of the chamber, a shape, a material composition, or a combination thereof.

8. A method for semiconductor processing, the method comprising:
    determining a non-uniformity of an electromagnetic field through a chamber, the electromagnetic field being during a process in the chamber, the process including using a plasma;
    determining a parameter of a material to control a voltage across the plasma resulting from the non-uniformity; and
    placing the material on a surface of the chamber based on the parameter.

9. The method of claim 8, wherein the process includes a deposition on a surface of a wafer.

10. The method of claim 8, wherein the determining the non-uniformity of the electromagnetic field includes determining a variation in thickness of a deposited film on a wafer.

11. The method of claim 8, wherein the parameter of the material includes a thickness, a material composition, a shape, an orientation on the surface of the chamber, or a combination thereof.

12. The method of claim 8, wherein a shape and a thickness of the material on the surface of the chamber corresponds to the non-uniformity of the electromagnetic field.

13. The method of claim 8, wherein the placing the material on the surface comprises placing at least two patterns at different locations on the surface.

14. The method of claim 13, wherein the at least two patterns have different compositions.

15. A method for semiconductor processing, the method comprising:
    depositing a film on a wafer in a chamber using a plasma;
    determining a non-uniformity of the plasma in the chamber, the determining being based at least in part on a uniformity of a thickness of the film on the wafer;
    determining a physical parameter of a material to control a voltage across the plasma in response to the non-uniformity of the plasma; and
    placing the material with the physical parameter on a surface of the chamber corresponding to the non-uniformity of the plasma.

16. The method of claim 15, wherein the determining the physical parameter of the material includes determining a size, shape, thickness, and material type of the material.

17. The method of claim 15, wherein the placing the material on the surface comprises placing at least two patterns at different locations on the surface.

18. The method of claim 15, wherein the material is selected from the group consisting essentially of aluminum oxide ($Al_2O_3$), titanium oxide ($TiO_2$), iron (Fe), or a combination thereof.

19. The method of claim 15, wherein the material has a pattern corresponding to the non-uniformity of the plasma.

20. The method of claim 15 further comprising:
    subsequent to the placing the material on the surface, depositing an additional film on an additional wafer in the chamber using the plasma;
    determining whether the plasma in the chamber has an acceptable uniformity based on the depositing the additional film; and
    if the plasma in the chamber does not have the acceptable uniformity, placing an additional material on an additional surface of the chamber.

21. A method comprising:
    processing a wafer in a chamber, the processing including using a plasma;
    determining a non-uniformity of a density of the plasma in the chamber during the processing; and
    placing a material pattern on an exterior surface of the chamber corresponding to the non-uniformity of the density of the plasma, the material pattern being a solid pattern before being placed on the exterior surface of the chamber.

* * * * *